US006537731B1

(12) United States Patent
Kraska et al.

(10) Patent No.: US 6,537,731 B1
(45) Date of Patent: Mar. 25, 2003

(54) DEVELOPER AND PROCESS FOR PREPARING FLEXOGRAPHIC PRINTING FORMS

(75) Inventors: Ursula Annerose Kraska, Weiterstadt (DE); Ute Erika Hirse, Darmstadt (DE)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/646,134

(22) Filed: Sep. 8, 2000

(30) Foreign Application Priority Data

Mar. 16, 1998 (DE) .......................... 198 11 330

(51) Int. Cl.[7] .............. G03F 7/30; G03F 7/32
(52) U.S. Cl. ............. 430/306; 430/331; 510/434; 510/170
(58) Field of Search ................. 430/306, 331; 510/434, 170

(56) References Cited

U.S. PATENT DOCUMENTS

| 3,989,634 A | * 11/1976 | Prochazka et al. .......... 510/434 |
| 4,177,074 A | 12/1979 | Proskow |
| 4,355,096 A | 10/1982 | Walls |
| 4,621,044 A | 11/1986 | Fujikawa |
| 4,837,122 A | 6/1989 | Kondo et al. |
| 5,075,192 A | 12/1991 | Fryd et al. |
| 5,155,011 A | 10/1992 | Zertani et al. |
| 5,155,012 A | 10/1992 | Joerg et al. |
| 5,175,076 A | 12/1992 | Ishikawa et al. |
| 5,278,030 A | 1/1994 | Ingham et al. |
| 5,695,903 A | 12/1997 | Elsaesser et al. |

FOREIGN PATENT DOCUMENTS

| EP | 0784232 | 7/1997 |
| JP | 6-297829 | 9/1994 |

OTHER PUBLICATIONS

Prochazka et al, CA 123:12392, ACS, one page, English abstract of Czech Patent No. 275821 issued Mar. 18, 1992.*
Crudden, Joseph J. et al., V–acyl ED3A chelating surfactants, INFORM, Surfactants & Detergents, Oct. 1995, vol. 6, No. 10, 1132–1144.

* cited by examiner

*Primary Examiner*—Cynthia Hamilton
(74) *Attorney, Agent, or Firm*—Thomas H. Magee

(57) ABSTRACT

An aqueous developer for photopolymerizable, flexographic printing plates containing an ethylenediamine triacetate-N-alkylacetamide having a long-chain aliphatic hydrocarbon radical in the N-alkylamido group and a process for preparing flexographic printing forms by the use of this developer are described.

11 Claims, No Drawings

DEVELOPER AND PROCESS FOR PREPARING FLEXOGRAPHIC PRINTING FORMS

BACKGROUND OF THE INVENTION

1. Field of the Invention

The invention involves an aqueous developer and a process for preparing flexographic printing forms by imagewise exposure of a recording material, washing off the uncrosslinked portions of the layer with the special aqueous developer, and drying the resulting treated recording material.

2. Description of Related Art

The use of photopolymerizable plates for preparing flexographic printing forms is known. The printing surface is produced by imagewise exposure of a layer that is photopolymerizable by actinic radiation and by subsequently removing the unexposed, unphotopolymerized areas of the printing plate. Aqueous solutions or organic solvents are usually employed as the developer, depending on the binder.

More and more aqueous developers have been used in recent years due to their lower environmental impact and decreased health hazard. Examples of aqueous developers being used are aqueous solutions of alkali metal hydroxides or carbonates and aqueous solutions of ionic or nonionic surfactants. Developers containing surfactants are described in JP 6-297829.

The washoff process is conducted mostly in washoff devices with rotating brushes of various materials. Inorganic developers as well as developers containing surfactants often leave deposits of the washed-off material on the brushes, the brush boards, and the walls of the device. Such deposits, which are often tacky polymer filaments, are located particularly at the base of the brush. The quality of the washoff process is impaired by these deposits. As this is not acceptable, the developer must be changed prematurely and the washoff device cleaned, which is often costly in time and labor. In addition, the deposits on the printing form lead to poor, smudged print images, particularly in the negative lines and between the screen elements.

Therefore, the problem involved in the present invention was to improve the washoff process for aqueous-developable flexographic printing plates, in particular, to prevent deposits of photopolymer material in the processor, in the brushes, and on the printing form surface.

SUMMARY

This problem is solved by an aqueous developer for photopolymerizable flexographic printing plates containing at least one trialkali salt of an N-alkylarnidocarboxymethylene-N',N",N"-tris (carboxymethylene)ethylenediamine having a long-chain aliphatic hydrocarbon radical in the N-alkylamido group, and by a process for preparing flexographic printing forms with the use of this developer.

DESCRIPTION OF THE PREFERRED EMBODIMENTS

Surprisingly, the developer of the present invention forms homogeneous dispersions of the washed-off photopolymer materials and causes only slight deposits in the processor, on the processor brushes, and on the processor walls, at, simultaneously, a higher washoff rate. Also, at a higher developer load, there are no tacky deposits that are difficult to remove; instead, fine, mostly brittle filaments are formed and are easy to remove. The surfaces of printing forms prepared with the developer of the present invention are free of deposits and thus, produce satisfactory printing results.

These advantages of the developer of the present invention were all the more surprising, because similar surfactants, such as, for example, coconut acid diethanolamide disclosed in JP 6-297829 and lauroyl ethylenediamine triacetate, described in *Inform*, Vol. 6, No. 10, (October 1995), cause very heavy contamination in the brushes and washoff device.

The present aqueous developer contains, as a component essential to the invention, at least one trialkali salt of an N-alkylamidocarboxymethylene-N',N",N"-tris (carboxymethylene)-ethylenediamine having a long-chain aliphatic hydrocarbon radical in the N-alkylamido group. These ethylenediamine triacetate alkylacetamides are used preferably in quantities of 0.1 percent by weight or more, 0.2 to 5 percent by weight being particularly preferred. In particular, 0.2 to 3 percent by weight are advantageous. Sodium salts are the preferred alkali salts. Preferred long-chain aliphatic hydrocarbon radicals in the N-alkylamido group are those having 6 to 22 carbon atoms in the chain, such as, for example, in the hydrocarbon chains (including the carboxyl group) of caprilic, capric, lauric, myristic, palrnitic, and oleic acid. Mixtures of the preceding are also suitable. Mixtures based on coconut fatty acids are especially preferred. Ethylenediamine triacetate-coconut alkylacetamide trisodium salt is particularly preferred.

The developer of the present invention can contain an amino alcohol and/or an amino carboxylic acid as an additive, because, these increase the washoff rate. Triethanolamine, tris(hydroxy-methyl)aminomethane, and nitrilotriacetic acid are preferred. The quantity of these additives is preferably 0.05 to 1.0 percent by weight, in particular 0.1 to 0.6 percent by weight.

Furthermore, fatty acids can be added to the developer, preferably 0.05 to 1.0 percent by weight, in particular 0.1 to 0.5 percent by weight. Oleic acid is particularly preferred. The addition of fatty acids is advantageous, as this makes the polymer particles even easier to remove.

The developer of the present invention can contain a polyamino acid as another additive. Polyaspartic acid is preferred, The added quantity is preferably 0.05 to 2.0 percent by weight, particularly 0.1 to 1.0 percent by weight.

The present developer is prepared by dissolving the appropriate quantities of the components in water before the development process. However, it is also possible to prepare a concentrate of the components and to dilute this with water to the required concentration just before the start of the washoff process. Such concentrates usually contain water, 10 to 90 percent by weight, preferably 30 to 60 percent by weight, of at least one ethylenediarnine derivative essential to the invention, 5 to 50 percent by weight, preferably 15 to 35 percent by weight, of at least one amino alcohol, and 5 to 50 percent by weight, preferably 15 to 35 percent by weight, of at least one fatty acid. The concentrate is diluted with water to produce a useful developer solution. This solution contains preferably 0.1 to 10 percent by weight, particularly 0.5 to 5 percent by weight of the concentrate. Particularly preferred are 0.5 to 3 percent by weight of the concentrate.

The developer of the present invention can be used in all conventional washoff devices, preferably in high-quality steel devices. All current brush materials, such as, for example, nylon, polyester, or polypropylene, can be used.

The washoff process is conducted preferably at an elevated temperature, usually at ≧30° C., in particular at 5° C.

The pH value of the developer is usually 8–11, preferably 8–10.

The present developer is suitable for developing aqueous-developable recording materials having photopolymerizable layers. These layers contain preferably hydrophilic polymers, optional hydrophobic polymers, photopolymerizable monomers, photoinitiators, and added auxiliaries, such as plasticizers, fillers, stabilizers, dyes, inhibitors, etc.

Aqueous-developable printing plates contain, as an essential binder, polymers having hydrophilic groups, such as, for example, hydroxyl, carboxyl, amino, nitrile, sulfate, and phosphate groups, or combinations of these groups. Examples are polyvinyl alcohols, polyvinyl acetates, copolymers of (meth)acrylic acid and (meth)acrylates, cellulose derivatives, polyesters, polyamides, carboxylated butadiene/acrylonitrile polymers, core-shell polymers having hydrophilic groups in the shell polymers, or block copolymers having hydrophobic and hydrophilic groups. Also useful are mixtures of these various polymers or mixtures with hydrophobic binders, such as thermoplastic elastomer copolymers, particularly with thermoplastic. elastomeric block copolymers. Linear and radial polystyrene/polybutadiene/polystyrene or polystyrene/polyisoprene/polystyrene block copolymers are preferred. Aqueous-developable flexographic printing plates are described in U.S. Pat. No. 5,175,076, European Publication EP-A 0 784 232, U.S. Pat. Nos. 4,621,044, 4,177,074, and 5,075,192.

The photopolymerizable materials can be applied onto commercial supports and exposed imagewise by current methods. After being developed with the developer of the present invention, the printing forms are dried, followed optionally by a chemical posttreatment and/or postexposure.

EXAMPLES

The following examples illustrate the present invention. Unless otherwise stated, the given parts and percentages are relative to weight.

Examples and Comparison Tests

The washoff time in the following examples and comparison examples was determined by measuring relief depths after 8, 10, 12, 14, and 16 minutes and subsequent regression analysis and normalized to 1 mm relief depth. The washoff times were measured with fresh aqueous developer and with aqueous developer loaded with 3 or 6 percent by weight photopolymer. Brush and processor contamination were determined visually.

Commercial, aqueous-developable Cyrel® AQS flexographic printing plates 1.70 mm thick) were used. Such a flexographic printing plate was preexposed overall first for 8 seconds from its backside in a tube exposure unit (Du Pont Cyrel® 1001 exposure unit wherein a 60 second exposure time provided 700 mJ/cm$^2$), then exposed imagewise for 8 min through a negative original, and treated at 50° C. with the aqueous developers to be tested in a commercial brush processor Du Pont Cyrel® AQS 24×30 (nylon brushes, brush area 72×87 cm$^2$). The weight percent content x of dispersed, unexposed, photopolymer material in the aqueous solution corresponds to an x % load (for example, a 3% load is 3 kg of unexposed photopolymer material in 100 kg solution). The pH value was measured in each case on freshly added solution and after a 6% load. The hardness value of water is given in German units.

Example 1

A 0.6% aqueous solution (completely deionized water) of ethylenediamine triacetate-coconut alkylacetamide trisodium salt (CAS No. 93 165-97-0) was used as the developer. The washoff times were 22, 27, and 36 minutes. The pH value changed from 10.5 to 8.9. Only traces of fine polymer filaments were detected up to a 3% load, increasing slightly up to a 6% load.

Example 2

A 2% aqueous solution (completely deionized water) of ethylenediamine triacetate-coconut alkylacetamide trisodium salt (CAS No. 93 165-97-0) was used as the developer. The washoff times were 21, 27, and 28 minutes. The pH value changed from 10.9 to 9.9. The brushes were completely clean up to a 3% load. Starting at a 4% load, fine, easily removable filaments deposited in the depth of the brush assembly.

Example 3

0.3% tris(hydroxymethyl)aminomethane was added to the Example 1 developer. The washoff times were 12, 13, and 13 minutes. The pH value changed from 10.6 to 9.2. The degree of contamination corresponded to that of Example 1.

Example 4

0.3% triethanolamine was added to the Example 1 developer. The washoff times were 12, 13, and 13 minutes. The pH value changed from 10.8 to 9.4. The degree of contamination corresponded to that of Example 1.

Example 5

Aqueous solutions, a) completely deionized water and b) tap water (8° hardness), of 0.5% ethylenediamine triacetate-coconut alkylacetamide trisodium salt, 0.3% triethanolamine, and 0.2% oleic acid were used as developers. The washoff times were 15, 18, and 18 minutes for version a) and 19, 20, and 22 minutes for version b). The pH value changed from 9.1 to 8.7 for a) and from 9.2 to 8.8 for b). No contamination was detected up to a 3% load, and the contamination increased only slightly at a higher load (up to 6%). The few polymer filaments and the slight processor contamination were easily removed due to the low tackiness of the polymer particles.

Example 6

An aqueous solution (completely deionized water) of 0.3% ethylenediamine triacetate-coconut alkylacetamide trisodium salt, 0.3% triethanolamine, and 0.2% oleic acid was used as developer. The washoff times were 18, 19, and 19 minutes. The pH value changed from 8.8 to 8.6. Only traces of filaments were detected up to a 3% load, and the contamination did not essentially increase at a higher load (up to 6%). The few polymer filaments and the slight processor contamination were easily removed due to the low tackiness of the polymer particles.

Example 7

An aqueous solution (completely deionized water) of 0.8% ethylenediamine triacetate-coconut alkylacetamide trisodium salt, 0.2% triethanolamine, and 0.2% oleic acid was used as developer. The washoff times were 17, 18, and 20 minutes. The pH value changed from 9.6 to 8.8. No contamination was detected up to 4% and hardly increased at a higher load (up to 6%). The few polymer filaments and the slight processor contamination were easily removed due to the low tackiness of the polymer particles.

Example 8

An aqueous solution (completely deionized water) of 0.6% ethylenediamine triacetate-coconut alkylacetamide trisodium salt, 0.3% tris(hydroxymethyl)aminomethane, 0.2% oleic acid, and 0.5% polyaspartic acid was used as developer. The washoff times were 12, 14, and 14 minutes. The pH value changed from 9.3 to 8.9. No contamination was detected up to 4% and also increased only slightly at a higher load (up to 6%). The few polymer filaments were very small, and the processor contamination was very slight.

Example 9

The developer of Example 8 was used, but with tap water (17–18° hardness) instead of completely deionized water. The washoff times were 14, 15, and 15 minutes. The pH value changed from 9.1 to 8.9. No contamination was detected up to 3% and also increased only slightly at a higher load (up to 6%). The few polymer filaments and the slight processor contamination were very easy to remove due to the low tackiness of the polymer particles.

Comparison Test 1

A 1% aqueous solution of coconut acid diethanolamide (the reaction product of 1 mole coconut acid and 2 moles diethanolamine) was used as developer. The washoff times were 16, 16, and 26 minutes. The pH value changed from 9.4 to 8.9. Distinct polymer filaments were visible in the brushes at 1% load, becoming larger very rapidly with increasing photopolymer load. At 6% load, the brushes and processor were completely contaminated and required very extensive cleaning.

Comparison Test 2

0.3, 0.5, 0.7, and 1% aqueous solutions of lauroyl ethylenediamine triacetate were used as developers. The washoff times for fresh solutions were 0.3%-67 minutes; 0.5%-48 minutes; 0.7%-37 minutes; and 1%-28 minutes. The pH value in each case was 4.8. Brushes and processor were highly contaminated by all solutions at low concentrations and could be cleaned only with great time and labor costs, because the deposits were very tacky.

Comparison Test 3

A 0.5% aqueous solution of a common surfactant, sodium lauryl sulfate, was used as developer. The washoff times for fresh solutions were 27, 39, and 32 minutes. Contamination increased continuously between 2 and 6% loads. At 4% load, washoff filaments were deposited on the plate surface and could hardly be removed due to their tackiness.

What is claimed is:

1. A process for preparing flexographic printing forms by
   a) imagewise exposing of a recording material comprising a support and at least one layer crosslinkable by actinic radiation, with actinic radiation crosslinking the exposed areas of the layer,
   b) washing off the uncrosslinked areas of the layer with an aqueous developer, and
   c) drying the treated recording material;
   wherein the aqueous developer contains at least one trialkali salt of an N-alkylamidocarboxymethylene-N',N",N"-tris(carboxymethylene)-ethylenediamine having a long-chain, aliphatic hydrocarbon radical in the N-alkylamido group.

2. The process according to claim 1, wherein the aqueous developer contains 0.2 to 5 percent by weight of said salt.

3. The process according to claim 1, wherein the hydrocarbon radical in the N-alkylamido group comprises an alkyl chain of 6–22 carbon atoms.

4. The process according to claim 1, wherein the hydrocarbon radical in the N-alkylamido group comprises an alkyl chain comprising a hydrocarbon chain selected from the group consisting of caprilic, capric, lauric, myristic, palmitic, and oleic acid, the hydrocarbon chain including the carbon atom of the carboxylic group.

5. The process according to claim 1, wherein the hydrocarbon radical in the N-alkylamido group comprises an alkyl chain comprising a hydrocarbon chain of coconut oil acids, including the carbon atom of the carboxylic group.

6. The process according to claim 1, wherein the aqueous developer contains at least one amino alcohol and/or one amino carboxylic acid as an additive.

7. The process according to claim 1 wherein the aqueous developer contains at least one polyamino acid as an additive.

8. The process according to claim 7, wherein the at least one polyamino acid is polyaspartic acid.

9. The process according to claim 1, wherein the aqueous developer contains at least one fatty acid as an additive.

10. An aqueous developer for photopolymerizable, flexographic printing plates containing at least one trialkali salt of an N-alkylamidocarboxymethylene-N',N",N"-tris(carboxymethylene)-ethylenediamine having a long-chain, aliphatic hydrocarbon radical in the N-alkylamido group and at least one fatty acid as an additive.

11. A developer concentrate for preparing an aqueous developer for photopolymerizable, flexographic printing plates, containing water, 10 to 90 percent by weight of at least one trialkali salt of an N-alkylamidocarboxymethylene-N',N",N"-tris(carboxymethylene)-ethylenediamine having a long-chain, aliphatic hydrocarbon radical in the N-alkylamido group, 5 to 50 percent by weight of at least one amino alcohol, and 5 to 50 percent by weight of at least one fatty acid.

* * * * *